United States Patent
Bacon et al.

(10) Patent No.: US 6,868,473 B2
(45) Date of Patent: Mar. 15, 2005

(54) NON-VOLATILE MEMORY ACCESS CONTROL

(75) Inventors: Kinney C. Bacon, Lawrenceville, GA (US); Lee R. Johnson, Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 316 days.

(21) Appl. No.: 10/283,714

(22) Filed: Oct. 30, 2002

(65) Prior Publication Data

US 2004/0088511 A1 May 6, 2004

(51) Int. Cl.[7] .............................................. G06F 12/00
(52) U.S. Cl. ....................... 711/103; 711/104; 711/152; 711/153; 711/154; 711/163; 711/164; 711/167; 365/185.01; 365/185.18; 365/185.29; 365/185.33; 365/222
(58) Field of Search ................. 711/103–104, 152–154, 711/158, 163–164, 167; 365/185.01, 185.18, 185.29, 185.33, 222

(56) References Cited

U.S. PATENT DOCUMENTS

| 4,821,240 | A  | * | 4/1989 | Nakamura et al. ........... 365/195 |
| 5,343,437 | A  | * | 8/1994 | Johnson et al. ......... 365/230.03 |
| 6,356,485 | B1 | * | 3/2002 | Proebsting ............. 365/189.01 |
| 6,519,716 | B1 | * | 2/2003 | Branstad ...................... 714/36 |
| 6,732,221 | B2 | * | 5/2004 | Ban ........................... 711/103 |

OTHER PUBLICATIONS

Haining et al., 1999, IEEE, pp. 321–328.*

* cited by examiner

*Primary Examiner*—Donald Sparks
*Assistant Examiner*—Hashem Farrokh (57) ABSTRACT

A system is described for controlling access to non-volatile memory. The system can include logic configured to determine whether to delay access to the non-volatile memory.

27 Claims, 7 Drawing Sheets

NON-VOLATILE MEMORY ACCESS CONTROL

TECHNICAL FIELD

The present invention is generally related to memory devices, and, more particularly, is related to memory devices with a finite number of access cycles.

BACKGROUND OF THE INVENTION

Memory exists, generally, because microcontrollers and microprocessors typically require some form of non-volatile and/or volatile memory for their basic operation. Semiconductor memory can broadly be categorized into two major families that are characterized by whether or not their data is retained when power to the memory is removed. Volatile memory, which loses its data when the power is removed, is commonly referred as random access memory (RAM). Non-volatile memory (NVM) retains its data when the power to the device is removed.

NVM is preferably the location where non-volatile code or data is stored. Non-volatile memory includes such memory types as FLASH, electrically erasable read only memory (EEROM (or electrically erasable programmable read only memory EEPROM)), electrically alterable read only memory (EAROM), among others. Non-volatile memory is popular in data storage applications and code storage applications. Historically, basic input/output systems (BIOS) memory for computers has stored application driving code (code-storage memory) and has included non-volatile memory, such as FLASH memory. Data-storage applications are numerous, and include digital still camera technology, voice/audio recorders, portable computers, and removable storage media, among others. Other applications include embedded devices. Embedded devices include computer functionality, and can include such devices as toasters, microwaves, VCRs, cable or satellite television set-top boxes, and other electronic devices, that include functionality to retain set-up information (e.g., device programming and the state of the machine or device, etc.) all in NVM. If the device loses power, that set-up information is retained and will be available for use when power is re-applied.

EEROM NVM typically has a low net number of access cycles, particularly erase-write (EW) cycles, with a typical range of 10,000 to 10 million EW cycles. One reason for this limited number of EW cycles has to do with the physics of the memory device. For example, charge tunneling is one mechanism to perform a write operation. In charge tunneling types of memory devices, charge is placed into a memory cell using some form of tunneling (e.g., Fowler-Nordheim tunneling, among others) which results in a "path" in the material comprising the memory cell. As the number of writes increases over time, the "path" creates a lowered resistance, which provides a path for charge to leak out of the memory cell. Thus, a need exists in the industry to address the aforementioned and/or other deficiencies and inadequacies.

BRIEF DESCRIPTION OF THE DRAWINGS

The preferred embodiments of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

The preferred embodiments of the invention now will be described more fully hereinafter with reference to the accompanying drawings. The preferred embodiments of the invention include a non-volatile memory (NVM) access system that is described below in the context of an embedded device, such as a set-top box, computer, digital video disk (DVD) player, among others. However, the NVM access system includes elements that can be embodied as separate elements distributed throughout a system such as a telephone communications system, home entertainment system, building management network, subscriber television system, among others. In particular, the preferred embodiments of the invention include systems and methods for controlling access to and/or from NVM. Access will herein be understood to include write, erase-write (EW) (i.e., wherein the data in one or more cells are erased prior to being written to), erase, and/or read operations to and/or from NVM, with emphasis placed on the EW operations to NVM. Further, although the preferred embodiments are described in the context of a system for controlling access to NVM, access applications to substantially any storage device with a finite number of access cycles are considered to be within the scope of the invention.

Since the preferred embodiments of the invention are described in the context of an NVM access system located in an embedded device, a generalized description of the NVM access system is described and followed by an illustration of one embodiment of an NVM access system included in an example embedded device. Following the description associated with the example embedded device are illustrations of the example counting and delay schemes employed by the NVM access system, as well as an example method for controlling access to NVM.

The preferred embodiments of the invention may, however, be embodied in many different forms and should not be construed as limited to the embodiments set forth herein; rather, these embodiments are provided so that this disclosure will be thorough and complete, and will fully convey the scope of the invention to those having ordinary skill in the art. Furthermore, all "examples" given herein are intended to be non-limiting, and are included as examples among others contemplated and within the scope of the invention.

Figure 1:
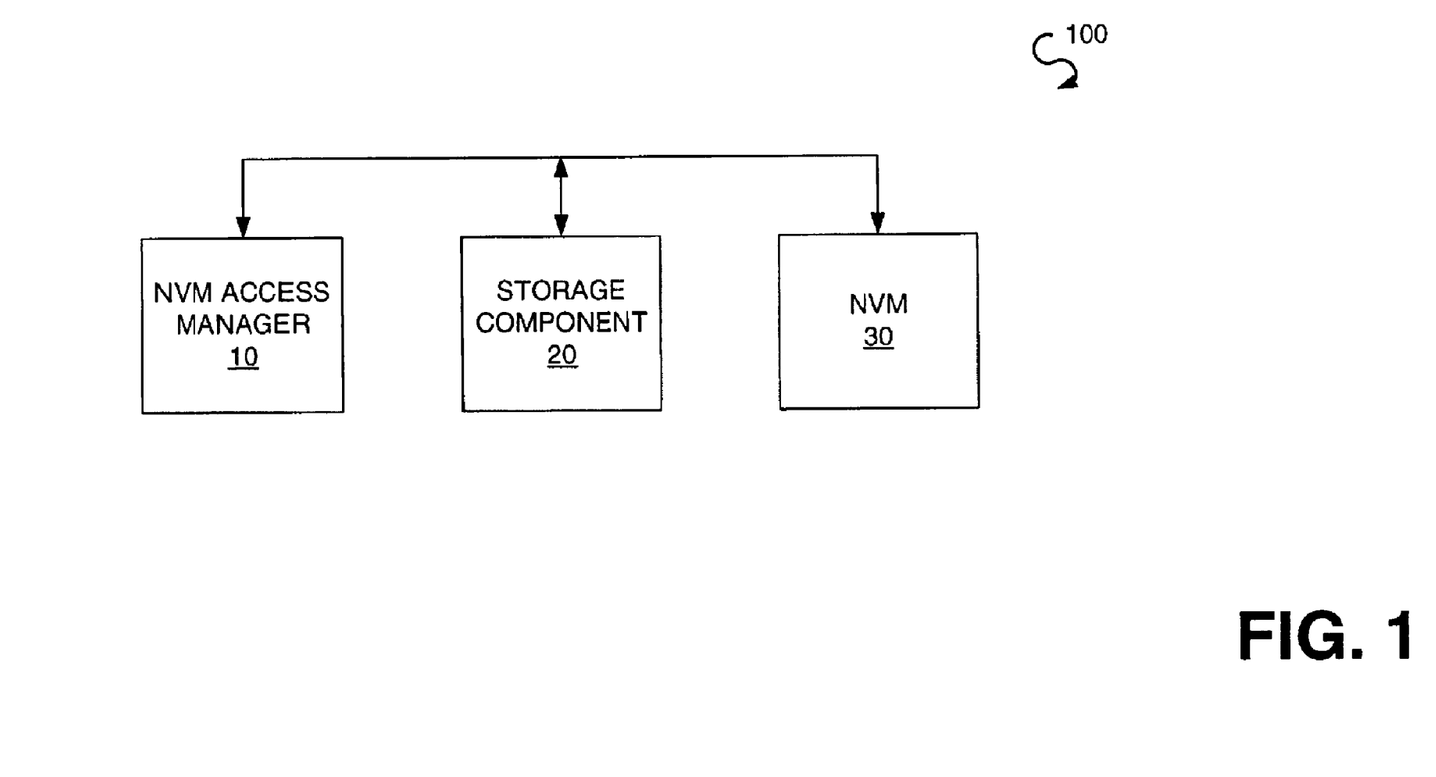
FIG. 1 is a block diagram of an example non-volatile memory (NVM) access system, in accordance with one embodiment of the invention.

FIG. 1 is a block diagram of an example NVM access system 100, in accordance with one embodiment of the invention. The NVM access system 100 includes an NVM access manager 10, a storage component 20, and non-volatile memory (NVM) 30. The NVM access manager 10 includes hardware and/or software to preferably keep track of one or more memory block counters associated with an NVM memory block or blocks, to track EW access lifecycle ticks, and to determine and accumulate access delays, as explained below. Note that this aforementioned functionality can be distributed among several components and/or devices in some embodiments. The storage component 20 preferably includes volatile memory components, for example, RAM or DRAM, among others, for use by the NVM access manager 10 in managing access to NVM 30.

These NVM access system elements can be embodied in a single device, such as in a set-top box or other embedded devices, and one or more of these system elements can be located on a single component such as an integrated chip (e.g., all in a single memory component) or distributed among different components and/or devices. For example, the NVM access manager 10 can be software resident in memory, for example as a module in an operating system. In other embodiments, the NVM access manager 10 can be hardware and/or firmware embodied in a single applications specific integrated circuit (ASIC) that cooperates with an integral arithmetic logic unit (ALU) and/or integral processor (not shown). In other embodiments, at least some of the processing functionality of the preferred embodiments of the invention can be performed external to and in cooperation with such an ASIC. The NVM access functionality in the ASIC can include some form of temporary data storage and/or receive data from an external data storage component or device. Further, NVM 30 can be co-located in the same device or in a separate device.

Figure 2A:
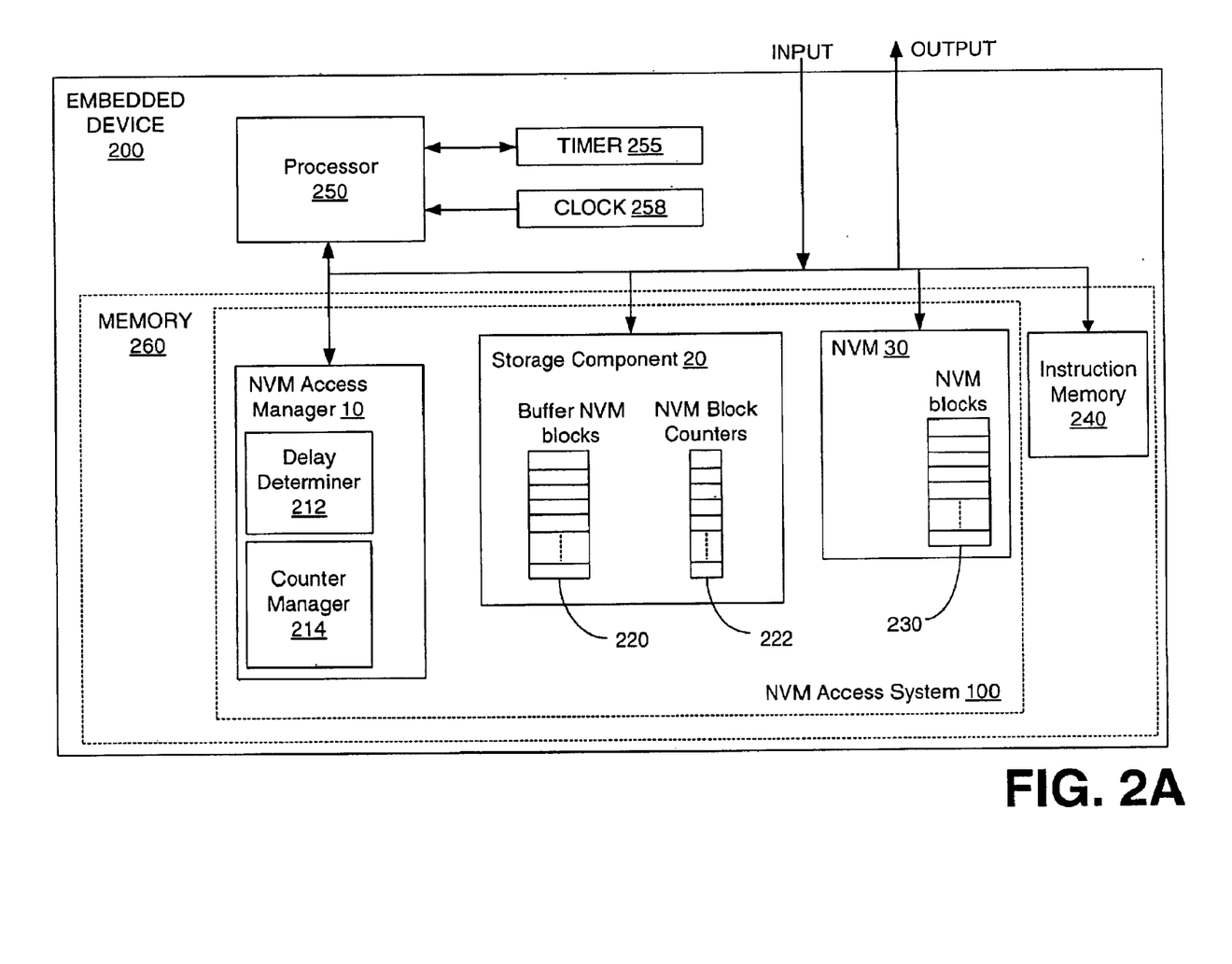
FIG. 2A is a block diagram of an example embedded device that includes the components of the NVM access system depicted in FIG. 1, in accordance with one embodiment of the invention.

FIG. 2A illustrates an example embedded device 200 that includes elements of the NVM access system 100 described in association with FIG. 1 among other select elements, in accordance with one embodiment of the invention. The example embedded device 200 includes a processor 250 (e.g., microprocessor) and memory 260, with the memory 260 including the NVM access system 100 and instruction memory 240, among others not shown. The processor 250 operates preferably in cooperation with a timer 255 and a clock 258. Note that in other embodiments, one or more of these embedded device elements can be included within the NVM access system 100, or one or more elements of the NVM access system can be external to the embedded device 200. The NVM access system 100 includes the NVM access manager 10 and a storage component 20. Although shown as separate components, the NVM access manager 10 can include the storage component 20 in some embodiments, or the storage component 20 can be external to the NVM access system 100 in other embodiments. The NVM access system 100 also includes NVM 30. Although access operations (for example, EWs) can occur to the entire NVM 30 in some embodiments (for example, one block can be employed for the entire NVM 30), preferably NVM 30 is broken down into several blocks of memory (collectively referenced as NVM blocks 230). For the example illustrated herein, assume that 64 blocks of 64 bytes each are employed. Further, assume that each EW cycle is capable of a 64 byte block write (i.e., one EW cycle writes to 64 bytes at a time), with the understanding that the scope of the invention includes larger or smaller block sizes and block writes.

In one implementation, the data in NVM blocks 230 are duplicated, at least in part, in the storage component 20, and temporarily stored in buffer NVM blocks 220. In the storage component 20, data in each block of the buffer NVM blocks 220 can be changed one or more times, or not at all, between EW cycles. Further, since the data stored in the buffer NVM blocks 220 should ideally be the same as the data that is to be stored in the NVM blocks 230, a read request (e.g., from an operating system or application) to the NVM access manager 10 preferably results in data being returned from the buffer NVM blocks 220 rather than from the NVM blocks 230, although that is not necessarily a limitation. Data in each block of the buffer NVM blocks 220 will be shuttled to the corresponding NVM blocks 230 during EW cycles. The storage component 20 also includes NVM block counters 222 for each block of the buffer NVM blocks 220. The NVM block counters 222 are preferably used by the counter manager 214 of the NVM access manager 10 (in cooperation with the processor 250, timer 255, and clock 258 in one implementation) to keep track of the EW cycles and EW lifecycle ticks for NVM 30. A delay determiner 212 in the NVM access manager 10 cooperates with the counter manager 214 to determine the EW delay to employ to enable NVM access control, as described below. The NVM block counters 222 can be practically any size, such as 2 bits, 6 bits, 8 bits, etc. In other embodiments, the storage component 20 may omit the buffer NVM blocks 220, and just maintain the NVM block counters 222. Still in other embodiments, the buffer NVM blocks 220 may not include the entire contents of the NVM blocks 230.

For example, the buffer NVM blocks 220 may only include data that is being buffered for later storage using the functionality of the NVM access manager 10, and thus there would not necessarily be a 1:1 correspondence between the content in the buffer NVM blocks 220 and the NVM blocks 230. Thus, only data being write-delayed would be stored, in one embodiment, in the buffer NVM blocks 220. In such embodiments, read requests for NVM data would preferably prompt a search of the buffed NVM blocks 220 and if the data was not found there, then a read operation would be performed on the NVM blocks 230. The decision as to whether to mirror only a portion of the NVM block data versus the data in the entire NVM blocks 230 is based in part on the needs of the particular product, performance requirements, and/or available buffer memory, among other considerations. For example, if the NVM 30 is small (e.g., 4 Kbytes), buffering the entire contents of the NVM blocks 230 may be appropriate. If the NVM is large (e.g., 128 Kbytes), it may be appropriate to buffer more selectively. Further variations in architecture of the NVM access system 100 are contemplated to be within the scope of the invention, including incorporating processing, timer, and/or clock functionality into the NVM access manager 10 in some embodiments, as described above.

The example embedded device 200 also includes the instruction memory 240, such as ROM, which is preferably used by the processor 250 for executing instructions. One skilled in the art would understand that the embedded device 200 (FIG. 2A) can also include other components not shown, including an operating system, device drivers, application software, and other application specific functionality, such as radio frequency tuners for set-top boxes, or cathode ray tubes (CRTs) for televisions, among others.

Figure 2B:
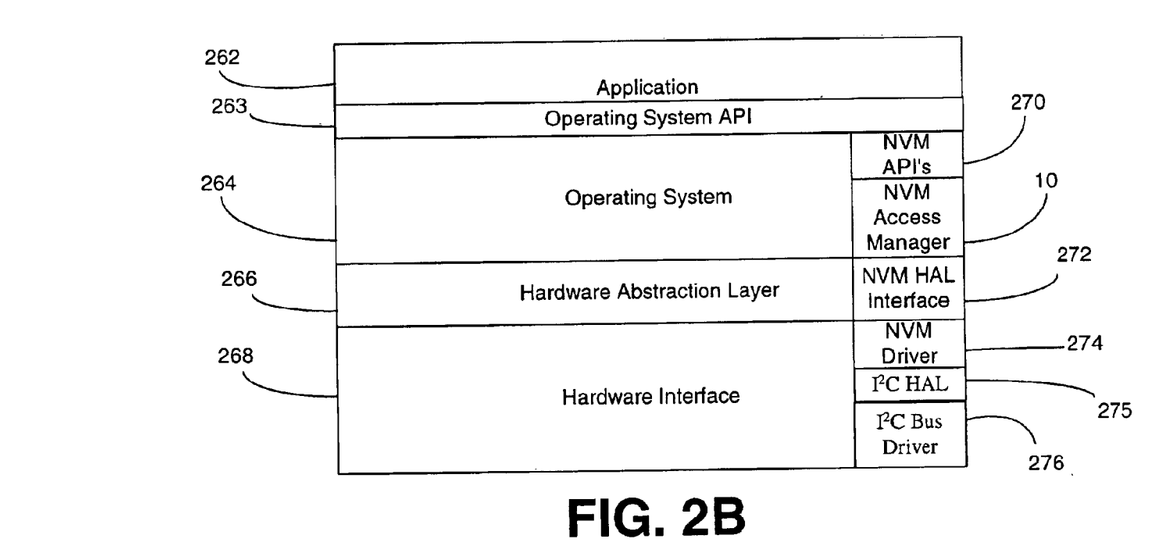
FIG. 2B is a block diagram of an example software stack implementation incorporating the NVM access manager of the NVM access system of FIG. 1, in accordance with one embodiment of the invention.

With continued reference to FIG. 2A, FIG. 2B illustrates an example software stack showing how the NVM access manager 10 can cooperate with different layers of control in the example embedded device 200 of FIG. 2A. The example software stack includes an application layer 262, an operating system layer 264, a hardware abstraction layer (HAL) 266, and a hardware interface layer 268. Note that the following set-up illustrates one example implementation, and that the NVM access manager 10 can be resident in one or more of the following levels in some embodiments. One or more programmed software applications, herein referred to as applications, may comprise the application layer 262. Applications can be executed by utilizing computing resources via one or more operating system application programming interfaces (APIs) 263 in the example embedded device 200. The applications may be resident in instruction memory 240 (FIG. 2A) or downloaded (or uploaded) into the storage component 20 (FIG. 2A) (e.g., RAM, DRAM, etc.).

The computing resources are preferably implemented at the operating system layer 264, which in one implementation includes the NVM access manager 10 and its corresponding components. An operating system enables the services of the NVM access manager 10 to be used by other software modules and facilitates the sharing of processor functions with other running processes. The operating system layer 264 is not necessary to implementing the preferred embodiments of the invention, but it does provide the NVM access manager 10 one environment to operate in. Cooperation with an application requiring a write to NVM 30 (FIG. 2A) is preferably implemented via one or more NVM API's 270.

The HAL 266 is preferably used to isolate applications and/or operating systems from variations in the underlying hardware. The HAL 266 can be considered as a set of specifications for layers above and below to follow to enable functions to be performed. If the hardware is changed, the higher level software using the hardware does not have to be re-written. The HAL 266 provides a mechanism for accessing devices, such as the NVM 30 (FIG. 3), with higher level code. The HAL 266 also includes mechanisms for determining various properties of an underlying device. For example, the NVM HAL interface 272 is an example of an HAL interface for the NVM access manager 10, the NVM driver 274, and the NVM 30. Other HAL interfaces can include a tuner system HAL, or a timer HAL, among others not shown. In one embodiment, the NVM access manager 10 can query the NVM driver 274 using the functions defined by the HAL interface 272 to determine NVM parameters such as size, life cycle parameters, block size, etc. The NVM driver 274, which is written to the interface specifications of the HAL 266, provides the correct replies based on the properties of the NVM 30.

Figure 2C:
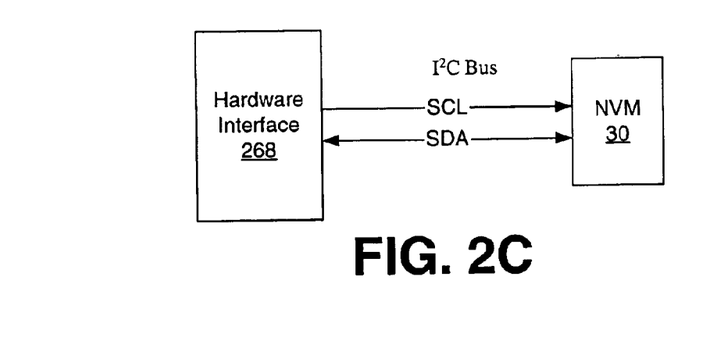
FIG. 2C is a block diagram illustrating one example hardware connection for interfacing with NVM, in accordance with one embodiment of the invention.
Figure 3:
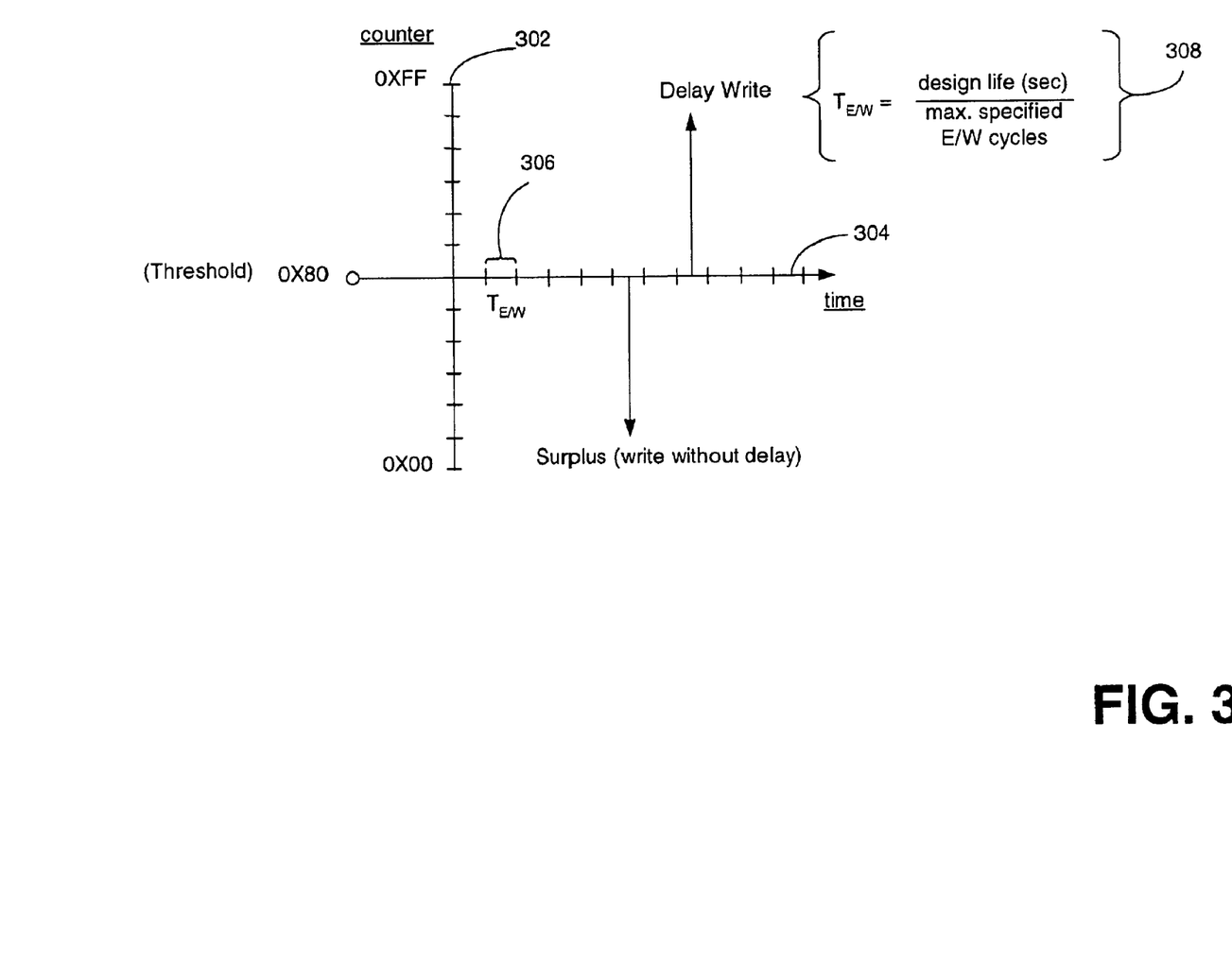
FIG. 3 is a timeline that illustrates one example block counter configuration, in accordance with one embodiment of the invention.

While the NVM driver 274 controls the reading and the writing of the NVM 30 (under the instructions of the NVM access manager 10 and specifications of the HAL interface 272), it does not interface directly with the hardware connecting the NVM 30 to the processor 250 (FIG. 3). This direct interface is accomplished via the I²C bus driver 276 and hardware. I²C is a well-known communication protocol that uses bi-directional communication between components that can switch roles between master and slave. The I²C bus driver 276 has its own I²C HAL interface 275 between the NVM driver 274 and the I²C bus driver 276. With continued reference to FIGS. 2A–2B, and referring to FIG. 2C, the I²C bus driver 276 cooperates with the processor 250 (or other controller) to control the bus. In other embodiments, the NVM access manager 10 can control the bus directly (i.e., without intervening software layers). The I²C bus driver 276, in cooperation with the processor 250 and clock 258, generates a serial clock (SCL), which in conjunction with the serial data signal (SDA) controls the bus timing, direction, and the transfer of data. One skilled in the art will understand that FIGS. 2A–2C represent one example embodiment among others. For example, although the NVM access manager 10 is shown at the operating system layer 264, it has functionality that can also be implemented at the application layer 262 and/or at the operating system layer 264, among other layers. Further, one or more of these layers can be omitted, or additional layers can be added. For example, in some embodiments, the instruction memory 240 and the processor 250 can be replaced with specialized hardware to implement the preferred embodiment of the invention, without the need for an operating system layer 264. In other embodiments, an operating system may provide an unprotected access method, and an application could add this functionality. This access functionality could be used solely for the operating system, or provided as a service for other applications. As another example of the breadth of scope contemplated in this disclosure, one mechanism was described in FIG. 2C, with the understanding that it represents one example of the more general notion of providing a mechanism for the processor 250 to store and retrieve information to and from the NVM 30. The NVM 30 can be embodied in various forms, and those differences (among others) can result in different interface mechanisms (e.g., SPI, serial, parallel, etc.).

FIG. 3 is a timeline illustrating counting functionality used by the counter manager 214 (FIG. 2A) for each block of the NVM block counters 222 (FIG. 2A), in accordance with one embodiment of the invention. Shown in FIG. 3 is a counter axis 302 that provides for bi-directional counting (shown in hexadecimal as one example), and a time axis 304 that is broken down by EW lifecycle ticks ($T_{EW}$) 306 (wherein lifecycle ticks are advancements in time at defined intervals when, for example, EWs can occur). This bi-directional counting configuration enables the counter manager 214 to maintain a balance sheet of EWs and EW lifecycle ticks. Assuming an 8-bit counter, as one example, there are 256 possible counter values ($2^8$). Note that one having ordinary skill in the art would understand that the scope of the invention includes larger or smaller maximum values for the counter. A threshold counter value of 0x80 was chosen as an arbitrary midpoint of the counting range. An EW to a particular block of the NVM blocks 230 (FIG. 2A) results in an increment of the counter, prompting the delay determiner 212 (FIG. 2A) to calculate a delay to be included in calculation of the next EW operation.

An EW lifecycle tick results in a decrement of the counter, which if it occurs at or below the threshold counter value, causes a surplus in EW cycles to be accumulated, resulting in a plurality of EWs that experience no delays (i.e., no "designed-in" NVM access delays) upon requests for EWs. The EW lifecycle tick 306 can be programmed into the NVM access manager 10 based on design criteria, and determined according to the EW lifecycle tick equation 308. As shown, the EW lifecycle tick 306 is preferably determined by dividing the design life (in seconds) by the maximum specified EW cycles.

In the examples that follow, a 7-year design life is assumed, and a maximum specified EW cycle of 1 million EW cycles is used to determine the EW lifecycle tick 306.

If EW cycles were limited to the EW lifecycle tick 306, after 7 years, NVM 30 (FIG. 2A) would preferably have some minimum retention time for data, say approximately 10 years of charge retention for this example. Although 7 years and 1 million cycles are used in the examples that follow, it is understood that such criteria are design choices, and consequently the scope of the invention includes other specified design criteria. Failure of the embedded device 200 (FIG. 2A) to abide by the specifications in actual use, such as by a rogue application (resident in memory 260 (FIG. 2A) or located remotely) causing a greater frequency of EWs to NVM 30, can reduce this residual charge retention to days or hours, resulting in lost data and/or failure of operation of the embedded device 200 or other cooperating system components.

The NVM access manager 10 (FIG. 2A) (via the counter manager 214, FIG. 2A) preferably maintains a balance sheet of EW debits and credits, delaying the EW when the counter value exceeds a threshold counter value, and backing off the delays (or accumulating credit towards non-delayed EWs when below the threshold counter value) for each EW lifecycle tick. EW delays are employed by appending a delay to each write request (WR), wherein the delays can accumulate enough to cause EW operations to occur at the specified EW lifecycle tick rate if WRs are excessive, thus preventing intermediary EWs corresponding to intermediary WRs (those occurring during the delay period) and preserving the life of the NVM 30 (FIG. 2A).

Figure 4A:
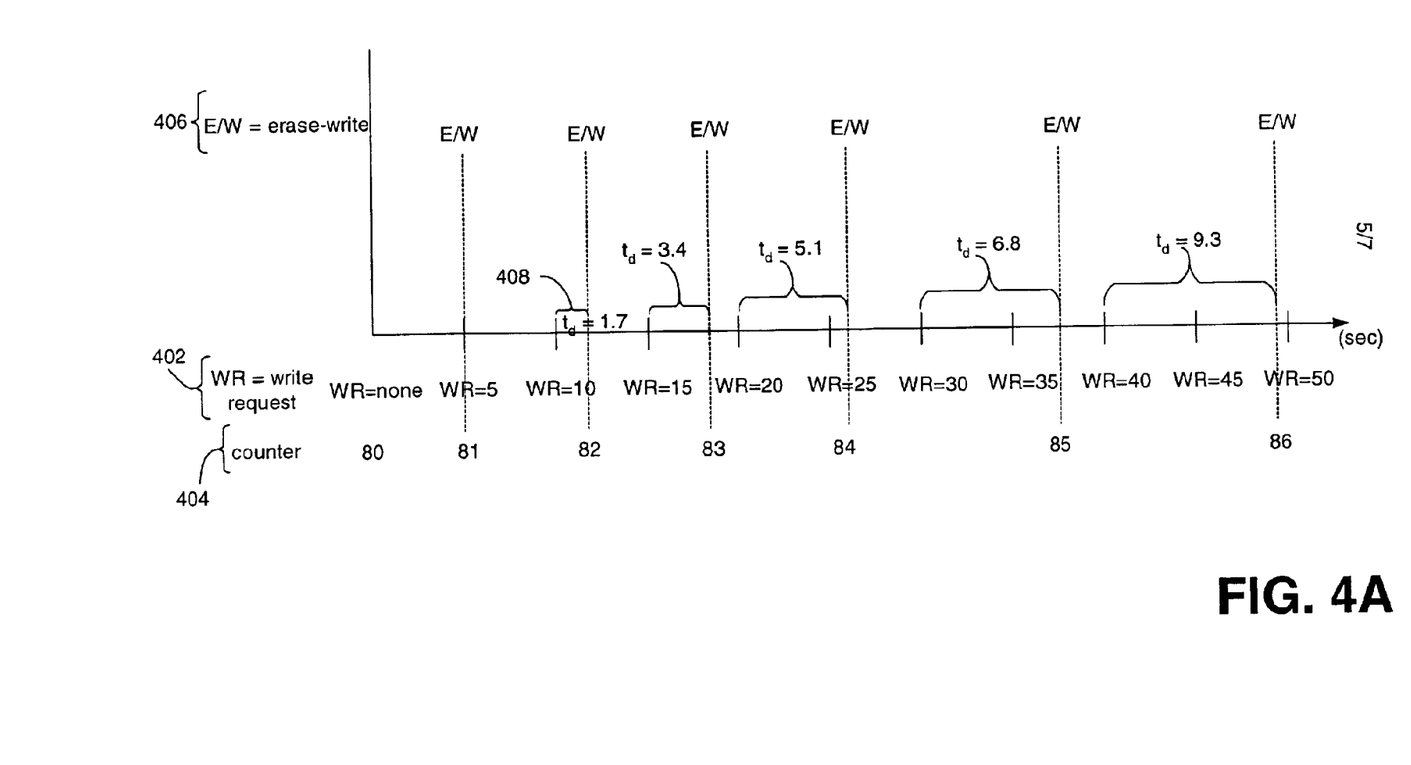
FIG. 4A is a timeline that illustrates how erase-write (EW) delays for counter values above a threshold counter value can accumulate, in accordance with one embodiment of the invention.

FIG. 4A is a timeline that illustrates how EW delays for counter values above a threshold counter value accumulate, in accordance with one embodiment of the invention. This example illustrates a rogue application (not shown) operating internally or externally to the embedded device 200 (FIG. 2A). The rogue application is requesting EWs at a frequency of once every 5 seconds (WRs indicated by WR line 402). The EW lifecycle tick expands beyond the x-axis here (i.e., time axis), since based on a 7 year design life and 1 million rated EW cycles for this example, a lifecycle tick of 221 seconds is established (e.g., based on plugging the design criteria into the equation 308 of FIG. 3). The counter line 404 includes shortened hexadecimals that illustrate how a particular block counter of the NVM block counters 222 (FIG. 2A) is incremented for each EW (each EW referenced in EW line 406). The association between the counter and the EW is reflected by the dotted line joining the same. Calculated delays, such as delay $t_d$ 408, are referenced from each WR.

Figure 4B:
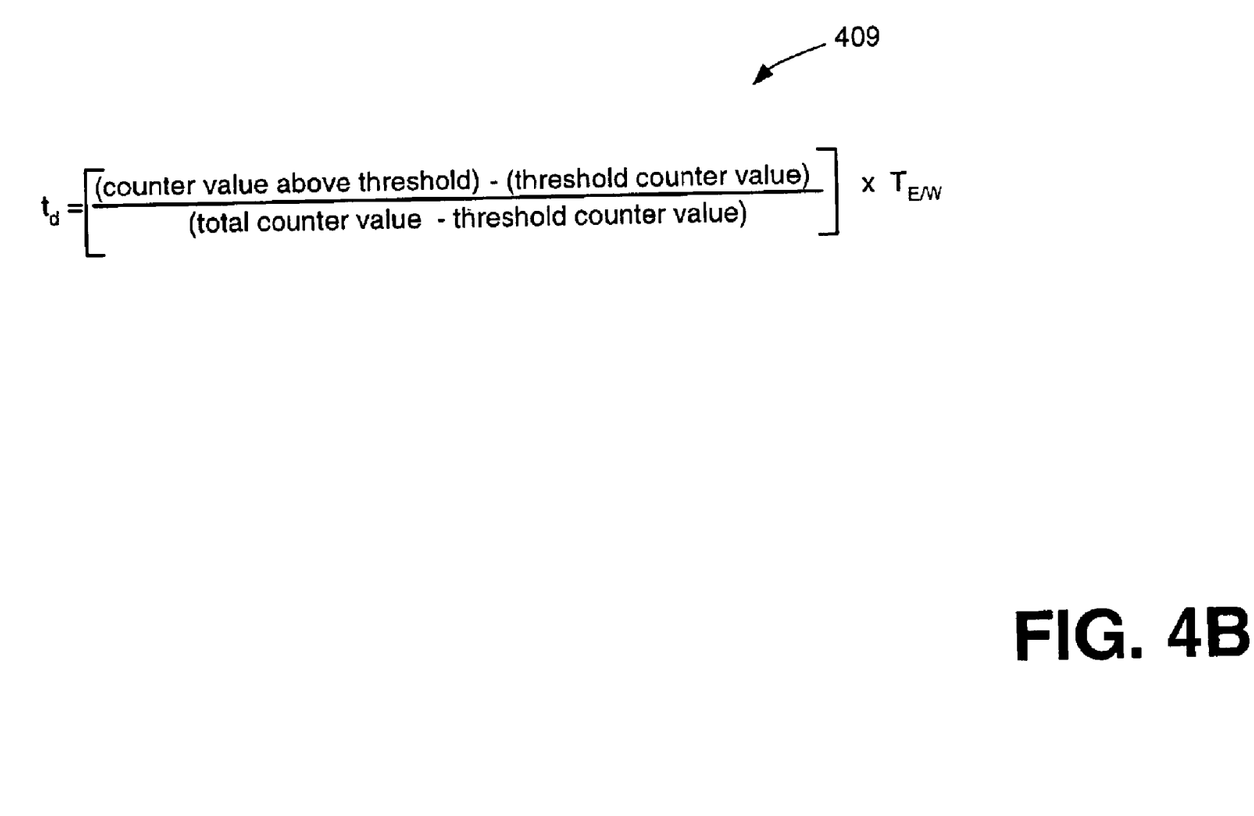
FIG. 4B is one formula for determining the EW delays depicted in FIG. 4A, in accordance with one embodiment of the invention.

Assuming a starting point at the threshold counter value of 80 (short for hexadecimal 0x80), the first WR occurs at 5 seconds past the starting point. As shown, the EW occurs at approximately the same time as the WR with no delay and the counter is incremented to 81. Further, a delay is calculated (e.g., via delay determiner 212, FIG. 2A) for the next EW. As shown in FIG. 4B, the delay, $t_d$ 408, is determined by equation 409 by calculating the difference between the counter value above threshold (here 0x81, or in decimal, 129) and the threshold counter value (here 0x80, or 128), divided by the difference between a total counter value and the threshold counter value, multiplied by the EW lifecycle tick (e.g., 221 sec). Note that in this example, an 8-bit signed value gives a range of −128 to +127. Since zero is a valid value, this range results in a total counter value of 256 in decimal. Although shown using hexadecimals and decimals, this subtraction can be performed using 2 s complement math, ASCII, among other subtraction mechanisms well known to those having ordinary skill in the art. Further, although shown using numbers, the math can be performed using variables as well.

The result of calculations using equation 409 (using the decimal equivalents 129 for hexadecimal 81 and 128 for hexadecimal 80 as one example) is a delay of [(129−128)/(256−128)]*221, or 1.7 seconds. This value will be appended to the next WR, providing for a delayed EW. Returning to FIG. 4A, as shown, the next WR occurs at 10 seconds, but the actual EW occurs at 11.7 seconds from the starting point (or 1.7 seconds beyond the WR at 10 seconds) because of the delay. The counter is incremented to 82 (decimal equivalent equal to 130), and a new delay is calculated for the next WR, and again based on the equation 409 (FIG. 4B), the delay is [(130−132)/(256−128)]*221, or 3.4 seconds. The next WR at 15 seconds results in an EW delayed 3.4 seconds from that WR, or at 18.4 seconds. Again, the counter is incremented (to hexadecimal 83), and a new delay is calculated to be 5.1 seconds.

When the next WR occurs at the 20 second mark, note that the delay will cause it to extend beyond the next WR that occurs at 25 seconds (since 5.1 is greater than 5 seconds). Referring to the example embedded device 200 shown in FIG. 2A, data written into one or more blocks of the buffer NVM blocks 220 (FIG. 2A) at the WR at 20 seconds will be overwritten by the data written into that block at the WR=25 seconds mark. Thus, the WR at 20 seconds does not prompt an immediate EW by the NVM access system 100 (FIG. 2A) to NVM 30 (FIG. 2A), although a write does occur to the buffer NVM blocks 220 for each WR. The WR at 20 seconds is used for the purpose of referencing the delay of 5.1 seconds (and for prompting writes to the buffer NVM blocks 220). Thus the data in storage component 20 (FIG. 2A) from the WR at 25 seconds is written to NVM 30 approximately 5.1 seconds after the WR at 20 seconds. The counter is then incremented to hexadecimal 84, and a new delay of 6.8 seconds is calculated. Again, the WR at 30 seconds does not prompt an immediate EW to NVM 30, but is written to the buffer NVM blocks 220 and the data resulting from the WR at 35 seconds is written to NVM 30, 6.8 seconds after the WR at 30 seconds.

The counter is incremented to hexadecimal 85, and a new delay is calculated to be 9.3 seconds. The WR at 40 seconds is the reference from which the delay is calculated and the data from storage component 20 (FIG. 2A) entered via the WR at 45 seconds is written to NVM 30 (FIG. 2A) at 9.3 seconds after the WR at 40 seconds. This process can continue to accumulate delays within an EW lifecycle tick until a maximum of the EW lifecycle tick (221 seconds) is reached, with WRs resulting in EWs to the buffer NVM blocks 220 in the storage component 20 but resulting in delayed EWs to NVM 30, such that EWs occur at the 221 second intervals to preserve the rated life of the NVM against the rogue application that is causing excessive writes. At the 221 second mark (the EW lifecycle tick interval), the counter decrements. If for some reason the EWs ceased, the counter would continue to decrement at each EW lifecycle tick until the delays disappeared and writes could occur without delay. Thus, delays within a lifecycle tick would begin at the first WR that occurs that is not within a delay period should the same or another rogue application cause excessive EWs again.

Figure 5:
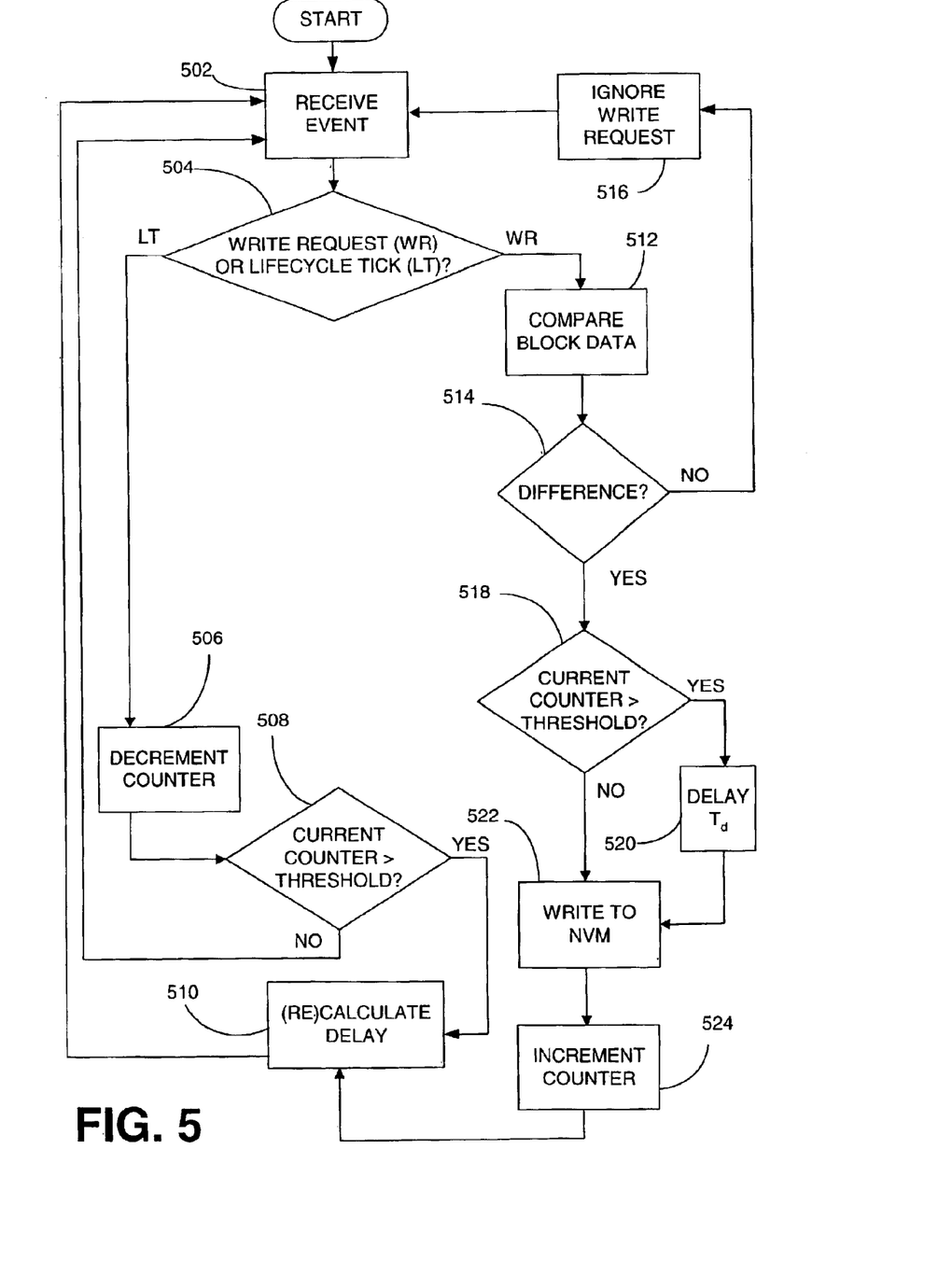
FIG. 5 is a flow diagram depicting one example method for controlling access to NVM, in accordance with one embodiment of the invention.

FIG. 5 is a flow diagram that illustrates one method the NVM access manager 10 (FIG. 2A) can employ to control access to NVM 30 (FIG. 2A), in accordance with one embodiment of the invention. An example for EW operations will be illustrated with the understanding that the following method can be applied to all access operations as defined herein. The blocks in the flow diagrams of FIG. 5 should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

Beginning at the start, step 502 includes receiving an event that prompts the NVM access manager 10 (FIG. 2A) into operation. This event can be, for example, a control signal from the processor 250 (FIG. 2A) in response to an interrupt generated from a peripheral device, such as a timer, an applications programming interface (API), or other component and/or device (not shown) enabling the NVM access manager 10 to execute NVM control access functionality. In other instances, this event can be a control signal from a temporary storage device or other device requesting a write, EW, erase, and/or read operation to and/or from the NVM 30 (FIG. 2A) via direct memory access.

As the NVM access manager 10 (FIG. 2A) is monitoring for write requests and lifecycle ticks, step 504 includes determining whether the event is a write request (WR) or a lifecycle tick (LT). If a lifecycle tick is detected, the counter is decremented (step 506) and a comparison of the value of the current counter value and the threshold counter value (e.g., 0x80) is made. This comparison can be performed by the processor 250 (FIG. 2A) or the NVM access manager 10 via combinational logic such as an ALU or other processing device, as would be understood by those having ordinary skill in the art. If the current counter value is greater than the threshold counter value, then a delay is calculated (or re-calculated if the current operating environment was under a delay situation) according to step 510. The delay is determined according to the equation 409 described above in association with FIG. 4B, and preferably performed by the delay determiner 212 (FIG. 2A) or in other embodiments by the processor 250 alone or in coordination with the delay determiner 212. If the current counter value is less than or equal to the threshold counter value, operations continue at step 502.

Returning back to step 504, if the received event is a write request, then in one implementation, a comparison is made of the affected block data (i.e., data in a block subject to a write) in NVM 30 (FIG. 2A) and the corresponding data in buffer NVM blocks 220 (FIG. 2A) in storage component 20 (FIG. 2A) (step 512). This comparison can be performed according to several mechanisms well known in the art. For example, a flag bit can be employed for each block of the buffer NVM blocks 220 indicating whether data has changed since the last write to NVM 30. In other instances, a flag may not be used, but instead, the data in an affected block can be scanned by a periodic wake-up coordinated with the timer 255 (FIG. 2A) (e.g., every 100 msec, or after every delay period has expired) and in cooperation with the NVM access manager 10 (FIG. 2A). In other embodiments, the comparison of data can be ignored and writes can occur such that NVM data in the NVM blocks 230 can be erase-written for writing in identical data.

Continuing to step 514, if there is no difference between data to be written and the data that is to be replaced, the write request is ignored (step 516), and operation continues to step 502. If there is a difference in data, a comparison is made between the current counter value and the threshold counter value to determine if the current environment is operating under a delay period (step 518). If the counter value is greater than the threshold counter value, then the NVM access manager 10 (FIG. 2A) knows it is in a delay period and thus it incorporates the delay (step 520) before it performs the write to the NVM 30 (FIG. 2A) (step 522). If the counter value was less than or equal to the threshold counter value, no delay was necessary and the NVM access manager 10 would implement the write (step 522). Step 524 includes incrementing a counter, and then operations proceed to step 510, wherein a new delay period is calculated and then the NVM access manager 10 awaits the next event.

In other embodiments, the accumulating delays can be omitted, and the NVM access manager 10 (FIG. 2A) could cause writes to only occur at 221-second intervals and prohibit EWs to NVM 30 (FIG. 3) for all intervening WRs. For example, surpluses in EWs could occur in the presence of continuing EW lifecycle ticks that occur in the absence of WRs, and EWs in response to WRs occur only at EW lifecycle tick intervals.

In some embodiments, the concept of "credit" can be issued for average downtime (e.g., power off time). As one example, in set-top box operations for subscriber television systems, a user may power off his or her set-top box on an average of 6 hours per day. The NVM access manager 10 (FIG. 2A) can be programmed to consider this downtime as EW credit (e.g., the threshold counter value may not be 0x80, but some lower value).

Further note that in some embodiments, a controlled shut-down of the system (e.g., due to a user request, an error handling mechanism that detects operating system problems, and/or from hardware detecting removal of power) can prompt a buffer flushing mechanism whereby all unsaved buffers of the buffer NVM blocks 220 are written to NVM 30 (FIG. 2A) immediately (and thus overriding the delay mechanisms of the preferred embodiments).

The NVM access manager 10 can be implemented in hardware, software, firmware, or a combination thereof. In the preferred embodiment(s), the NVM access manager 10 is implemented in software or firmware that is stored in memory and that is executed by a suitable instruction execution system. If implemented in hardware, as in an alternative embodiment, the NVM access manager 10 may be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The NVM access manager 10 which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the instructions and/or data for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the instructions and/or data is printed, as the instructions and/or data can be electronically captured, via for instance optical scanning of the paper or other medium, then compiled, interpreted or otherwise processed in a suitable manner if necessary, and then stored in a computer memory.

It should be emphasized that the above-described embodiments of the present invention, particularly, any "preferred embodiments" are merely possible examples of implementations, merely setting forth a clear understanding of the principles of the inventions. Many variations and modifications may be made to the above-described embodiments of the invention without departing substantially from the spirit of the principles of the invention. All such modifications and variations are intended to be included herein within the scope of the disclosure and present invention and protected by the following claims.

Therefore, having thus described the invention, at least the following is claimed:

1. A method for controlling access to non-volatile memory, said method comprising the steps of:
   receiving a request for access to non-volatile memory;
   responsive to receiving the request, determining whether to delay access to the non-volatile memory; and
   maintaining a counter for a block of the non-volatile memory, wherein the counter includes a threshold counter value that divides the counter into a delayed access portion and a non-delayed access portion, wherein counter values in the delayed access portion results in a defined delay in access in response to an access request, wherein counter values at the threshold counter value and in the non-delayed access portion results in no defined delay in access in response to an access request.

2. The method of claim 1, further including the step of delaying access to the non-volatile memory by a defined delay value if a current counter value is above a threshold counter value.

3. The method of claim 2, wherein the defined delay value is determined by subtracting the threshold counter value from a current counter value, dividing the difference by the difference between a total counter value and the threshold counter value, and multiplying the quotient by a lifecycle tick, wherein the lifecycle tick is determined by dividing a design life of the non-volatile memory by maximum specified access cycles.

4. The method of claim 1, further including the step of delaying access within a lifecycle tick until up to a maximum delay equal to the lifecycle tick, wherein the lifecycle tick is determined by dividing a design life of the non-volatile memory by maximum specified access cycles.

5. The method of claim 1, further including the step of incrementing the counter after each access.

6. The method of claim 1, further including the step of decrementing the counter after each lifecycle tick, wherein the lifecycle tick is determined by dividing a design life of the non-volatile memory by maximum specified access cycles.

7. The method of claim 1, further including the step of comparing data in a block of the non-volatile memory and data in a storage component, between which access is implemented.

8. The method of claim 7, further including the step of ignoring the request for access if the data in the storage component has the same value as the data in the compared block in the non-volatile memory.

9. The method of claim 1, wherein access includes at least one of reading from the non-volatile memory, erasing data in the non-volatile memory and writing to the non-volatile memory, erasing data in the non-volatile memory, and writing to the non-volatile memory.

10. The method of claim 1, further including the steps of determining not to delay access upon receiving an indication of a controlled shutdown to be implemented, and transferring data to at least a portion of the non-volatile memory to save the data.

11. A method for controlling access to non-volatile memory, said method comprising the steps of:
    receiving a request for access to non-volatile memory; and
    responsive to receiving the request, enabling access to the non-volatile memory in intervals of lifecycle ticks, wherein the lifecycle ticks are determined by dividing a design life of the non-volatile memory by maximum specified access cycles.

12. The method of claim 11, wherein access includes at least one of reading from the non-volatile memory, erasing data in the non-volatile memory and writing to the non-volatile memory, erasing data in the non-volatile memory, and writing to the non-volatile memory.

13. A method for controlling access to non-volatile memory, said method comprising the steps of:
    receiving a request for access to a block of non-volatile memory;
    maintaining a counter for a block of the non-volatile memory, wherein the counter includes a threshold counter value that divides the counter into a delayed access portion and a non-delayed access portion, wherein counter values in the delayed access portion results in a defined delay in access in response to an access request, wherein counter values at the threshold counter value and in the non-delayed access portion results in no defined delay in access in response to an access request;
    responsive to receiving the request, determining whether to delay access to the non-volatile memory;
    delaying access to the non-volatile memory by a defined delay value if a current counter value is above the threshold counter value, wherein the defined delay value is determined by subtracting the threshold counter value from a current counter value, dividing the difference by the difference between a total counter value and the threshold counter value, and multiplying the quotient by a lifecycle tick, wherein the lifecycle tick is determined by dividing a design life of the non-volatile memory by maximum specified access cycles;
    incrementing the counter after each access;
    decrementing the counter after each lifecycle tick; and
    delaying access within the lifecycle tick until up to a maximum delay equal to the lifecycle tick.

14. A system for controlling access to non-volatile memory, said system comprising:
    a non-volatile memory having an access block; a counter for the access block;
    access manager logic configured to receive a request for access to the access block of the non-volatile memory and, responsive to receiving the request, determine whether to delay access to the access block of the non-volatile memory; and wherein the access manager logic further includes counter manager logic configured to track the counter for the access block, wherein the counter includes a threshold counter value that divides the counter into a delayed access portion and a non-delayed access portion, wherein counter values in the delayed access portion results in a defined delay in access in response to an access request, wherein counter values at the threshold counter value and in the non-delayed access portion results in no defined delay in access in response to an access request.

15. The system of claim 14, wherein the access manager logic is further configured to delay access to the non-volatile memory by a defined delay value if a current counter value is above a threshold counter value.

16. The system of claim 15, wherein the access manager logic further includes delay determiner logic, wherein the delay determiner logic is configured to calculate the defined delay value by subtracting the threshold counter value from a current counter value, dividing the difference by the difference between a total counter value and the threshold counter value, and multiplying the quotient by a lifecycle tick, wherein the lifecycle tick is determined by dividing a design life of the non-volatile memory by maximum specified access cycles.

17. The system of claim 14, wherein the access manager logic is further configured to delay access within a lifecycle tick until up to a maximum delay equal to the lifecycle tick, wherein the lifecycle tick is determined by dividing a design life of the non-volatile memory by maximum specified access cycles.

18. The system of claim 14, wherein the counter is incremented after each access.

19. The system of claim 14, wherein the counter is decremented after a lifecycle tick, wherein the lifecycle tick is determined by dividing a design life of the non-volatile memory by maximum specified access cycles.

20. The system of claim 14, wherein the access manager logic is further configured to compare data in a block of the non-volatile memory and data in a storage component, between which access is implemented.

21. The system of claim 20, wherein the access manager logic is further configured to ignore the request for access if the data in the storage component has the same value as the data in the compared block in the non-volatile memory.

22. The system of claim 14, wherein access includes at least one of reading from the non-volatile memory, erasing data in the non-volatile memory and writing to the non-volatile memory, erasing data in the non-volatile memory, and writing to the non-volatile memory.

23. The system of claim 14, wherein the access manager logic is further configured to determine not to delay access upon receiving an indication of a controlled shutdown to be implemented, and transferring data to at least a portion of the non-volatile memory to save the data.

24. A system for controlling access to non-volatile memory, said system comprising:

a non-volatile memory having at least one access block;

a counter for the access block; and access manager logic configured to receive a request for access to the access block of the non-volatile memory and, responsive to receiving the request, enable access to the access block of the non-volatile memory in intervals of lifecycle ticks, wherein the lifecycle ticks are determined by dividing a design life of the non-volatile memory by maximum specified access cycles.

25. The system of claim 24, wherein access includes at least one of reading from the non-volatile memory, erasing data in the non-volatile memory and writing to the non-volatile memory, erasing data in the non-volatile memory, and writing to the non-volatile memory.

26. A system for controlling access to non-volatile memory, said system comprising:

a non-volatile memory having an access block;

a counter for the access block, wherein the counter includes a threshold counter value that divides the counter into a delayed access portion and a non-delayed access portion, wherein counter values in the delayed access portion results in a defined delay in access in response to an access request, wherein counter values at the threshold counter value and in the non-delayed access portion results in no defined delay in access in response to an access request, wherein the counter is incremented after each access, wherein the counter is decremented after each lifecycle tick, wherein the lifecycle tick is determined by dividing a design life of the non-volatile memory by maximum specified access cycles;

access manager logic including counter manager logic and delay determiner logic, wherein the counter manager logic is configured to track the counter for the access block, wherein the access manager logic is configured to receive a request for access to the access block of the non-volatile memory and, responsive to receiving the request, determine whether to delay access to the access block of the non-volatile memory, wherein the access manager logic is further configured to delay access to the access block of the non-volatile memory by a defined delay value if a current counter value is above the threshold counter value, wherein the access manager logic is further configured to delay access within a lifecycle tick until up to a maximum delay equal to the lifecycle tick, wherein the delay determiner logic is configured to calculate the defined delay value by subtracting the threshold counter value from a current counter value, dividing the difference by the difference between a total counter value and the threshold counter value, and multiplying the quotient by the lifecycle tick.

27. A system for controlling access to non-volatile memory on a computer-readable medium, said system comprising:

logic configured to receive a request for access to non-volatile memory;

logic configured to determine whether to delay access to an access block of the non-volatile memory in response to an access request; and wherein the logic configured to determine is further configured to delay access to the access block of the non-volatile memory by a defined delay value if a current counter value is above a threshold counter value, wherein the logic configured to determine is further configured to delay access within a lifecycle tick until up to a maximum delay equal to a lifecycle tick, wherein the lifecycle tick is determined by dividing a design life of the non-volatile memory by maximum specified access cycles.

* * * * *